(12) United States Patent
Noys

(10) Patent No.: US 10,607,774 B2
(45) Date of Patent: Mar. 31, 2020

(54) CONNECTION OF COILS TO SUPPORT STRUCTURES IN SUPERCONDUCTING MAGNETS

(71) Applicant: Siemens Healthcare Limited, Camberley (GB)

(72) Inventor: Jonathan Noys, Abingdon (GB)

(73) Assignee: Siemens Healthcare Limited, Camberley (GB)

(*) Notice: Subject to any disclaimer, the term of this patent is extended or adjusted under 35 U.S.C. 154(b) by 159 days.

(21) Appl. No.: 15/941,260

(22) Filed: Mar. 30, 2018

(65) Prior Publication Data
US 2018/0286572 A1    Oct. 4, 2018

(30) Foreign Application Priority Data
Mar. 30, 2017 (GB) .................... 1705115.2

(51) Int. Cl.
*H01F 41/04* (2006.01)
*H01F 27/32* (2006.01)
*G01R 33/3815* (2006.01)
*H01F 6/02* (2006.01)
*H01F 6/06* (2006.01)
*G01R 33/38* (2006.01)

(52) U.S. Cl.
CPC ....... *H01F 41/048* (2013.01); *G01R 33/3802* (2013.01); *G01R 33/3815* (2013.01); *H01F 6/02* (2013.01); *H01F 6/06* (2013.01); *H01F 6/065* (2013.01); *H01F 27/327* (2013.01)

(58) Field of Classification Search
CPC . H01F 27/327; H01F 6/02; H01F 6/06; H01F 6/065; G01R 33/3802; G01R 33/3815
See application file for complete search history.

(56) References Cited

U.S. PATENT DOCUMENTS

| | | | |
|---|---|---|---|
| 5,402,094 A * | 3/1995 | Enge | G01R 33/3875 324/319 |
| 8,151,443 B2 | 4/2012 | Hobbs et al. | |
| 9,536,659 B2 * | 1/2017 | Calvert | G01R 33/3802 |
| 2007/0247263 A1 * | 10/2007 | Calvert | G01R 33/3802 335/216 |
| 2011/0012698 A1 * | 1/2011 | Hutton | G01R 33/3802 335/216 |
| 2012/0075045 A1 * | 3/2012 | Calvert | G01R 33/3804 335/216 |

FOREIGN PATENT DOCUMENTS

| | | |
|---|---|---|
| GB | 2503190 A | 12/2013 |
| GB | 2538788 A | 11/2016 |

* cited by examiner

*Primary Examiner* — Mohamad A Musleh
(74) *Attorney, Agent, or Firm* — Schiff Hardin LLP

(57) ABSTRACT

A cylindrical superconducting magnet coil structure has superconducting coils and spacers bonded together at joints to form a self-supporting structure. A layer of additional material is provided, overlaying a joint and extending onto an adjacent regions of a spacer and a coil.

5 Claims, 4 Drawing Sheets

US 10,607,774 B2

CONNECTION OF COILS TO SUPPORT STRUCTURES IN SUPERCONDUCTING MAGNETS

BACKGROUND OF THE INVENTION

Field of the Invention

The present invention provides cylindrical superconducting magnet coil structures, for example as used in Magnetic Resonance Imaging (MRI) systems. Such magnets must be cooled to below the transition temperature of the superconducting wire used which requires the superconducting magnet coil structure to be placed in a cryostat to isolate it from ambient temperature.

Description of the Prior Art

FIG. 1 shows an example conventional arrangement of a cryostat including a cryogen vessel 12. A superconducting magnet has a coil structure 10 within cryogen vessel 12, itself retained within an outer vacuum chamber (OVC) 14. One or more thermal radiation shields 16 are provided in a vacuum space between the cryogen vessel 12 and the outer vacuum chamber 14. In some known arrangements, a refrigerator 17 is mounted in a refrigerator sock 15 located in a turret 18 provided for the purpose, toward the side of the cryostat. Alternatively, a refrigerator 17 may be located within access turret 19, which retains access neck (vent tube) 20 mounted at the top of the cryostat. The refrigerator 17 provides active refrigeration to cool cryogen gas within the cryogen vessel 12, in some arrangements by recondensing it into a liquid. The refrigerator 17 may also serve to cool the radiation shield 16. As illustrated in FIG. 1, the refrigerator 17 may be a two-stage refrigerator. A first cooling stage is thermally linked to the radiation shield 16, and provides cooling to a first temperature, typically in the region of 80-100K. A second cooling stage provides cooling of the cryogen gas to a much lower temperature, typically in the region of 4-10K.

In the example of a conventional superconducting magnet structure, a number of coils are wound into cavities defined on a radially outer surface of a cylindrical former, for example of aluminium. The coils are then impregnated with a thermosetting resin.

The multiple of superconducting coils are accordingly supported by the former through a frictional interface. Frictional interfaces are a cause of quenches and these can be eliminated by directly joining the superconducting coil to the support structure. Such arrangement may be found in the so-called "serially bonded" magnet arrangement, such as described for example in WO2016020205 A1. In such arrangements, coils are joined by spacers to keep them at a desired axial spacing and axial alignment. The coils and the spacers are bonded together to form a self-supporting structure. FIG. 2 schematically shows a half-cross-section of a serially bonded coil assembly, to which the present invention may be applied. The structure is rotationally symmetrical about axis A-A.

A problem with this solution is that each joint between a superconducting coil 100 and the adjacent support structure 102 is complex and requires special attention to ensure the join is not compromised, since a compromised joint might result in reduced performance of the MRI magnet. The present invention enables stress concentration which may be developed at each joint to be managed in a cost efficient way.

Frictional interfaces have been developed to contain many different materials to reduce the friction between the coil and support structure with the aim to reduce quenches. This development has given some gains but many magnets still quench due to frictional energy release at the interface between coil and support structure.

To reduce relative movement between coils and support structure the thermal contraction of the coils and the support structure may be closely matched. However, the energisation of the magnet will cause relative coil expansion due to hoop strain and will result in frictional energy release. The coils can be wound at high tension and/or overwound with high strength wire to reduce the hoop expansion.

Within a superconducting magnet there are times where large voltage differentials are created between coils or between a coil and the support structure, e.g. in case of quench. To protect the coils from damage, it may be preferred that the coils are electrically insulated. The present invention offers a solution to this.

SUMMARY OF THE INVENTION

The present invention provides a superconducting magnet coil structure which addresses some of the disadvantages of the conventional structure described above.

The present invention particularly addresses superconducting coil assemblies of a so-called "serially bonded" construction. In such arrangements, coils are joined by spacers to keep then at a desired axial spacing and axial alignment. The coils and the spacers are bonded together to form a self-supporting structure.

DESCRIPTION OF THE PREFERRED EMBODIMENTS

The present invention relates to serially-bonded coil structures. That is to say, coil structures comprising coils joined by spacers; the coils and the spacers are bonded together to form a self-supporting structure.

Figure 1:
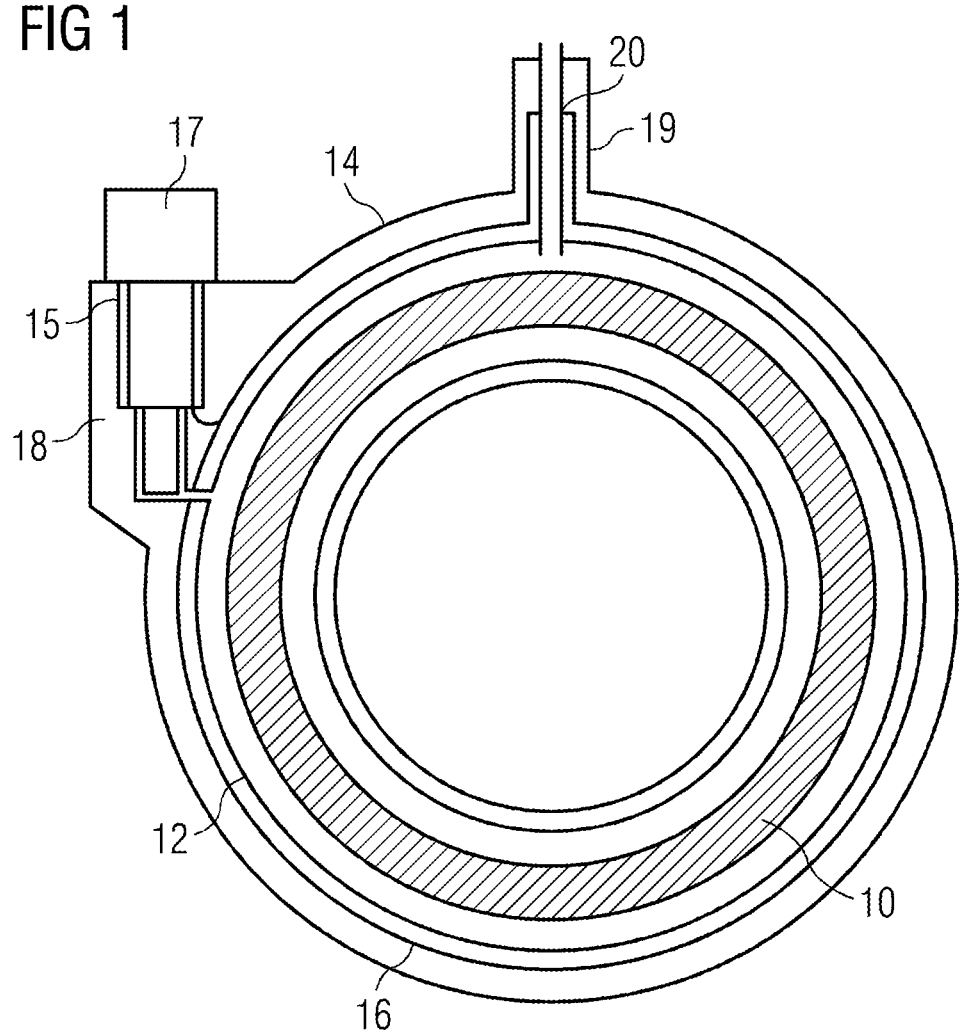
FIG. 1 schematically shows a conventional arrangement of a superconducting magnet within a cryostat.
Figure 2:
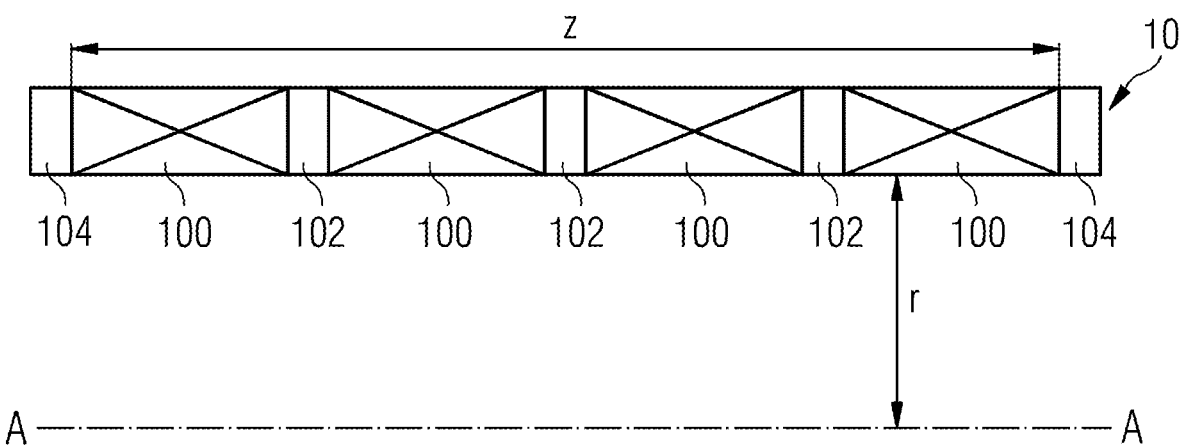
FIG. 2 schematically shows a radial half-cross-section of a serially bonded coil assembly, to which the present invention may be applied.

An example of a serially-bonded coil structure 10 is shown in FIG. 2 as a schematic radial half-cross-section. The structure is essentially rotationally symmetrical about axis A-A. The terms "radial" and "axial" and similar terms will be used herein to denote directions and dimensions which are respectively: "perpendicular to the axis A-A and extending in a plane which contains the axis A-A"; and "parallel or co-incident with the axis A-A". Similarly, terms such as "outer" and "inner" refer to relative proximity to the midpoint of axis A-A. Dimension r is typically about 50 cm, and dimension z is typically about 150 cm for an MRI Magnet, and smaller dimensions for a typical NMR magnet. A number of coils 100 of superconducting wire are provided, each impregnated with a material such as a thermosetting resin, as is conventional in itself. Coils 100 are separated by spacers 102. The spacers may be composed of wire, such as resistive copper wire, wound into coils and impregnated with an impregnating material such as a thermosetting resin; or may be composed of an inert material such as glass fibre cloth or filament, wound and impregnated with a similar impregnating material. Other possible compositions for the spacers include a bulk material formation, being an epoxy resin filled with particles or fibres; or a plastic pre-formed spacer. The coils are of axial and radial dimensions determined to fulfil their function as sources of magnetic field and to allow robust and not unduly troublesome manufacture, as will be apparent to those skilled in the art. As is also apparent to one skilled in the art, a given objective of magnetic field strength, field homogeneity and dimensions of the homogeneous region may be achieved by a number of different arrangements of coils, having different dimensions, spacing and number. The designer will choose an appropriate arrangement based on other constraints particular to the design in question.

In an example method of manufacture of such a serially bonded coil structure 10, the coil assembly 10 may be formed of separate coils 100 and spacers 102 bonded together by a thermosetting resin or similar.

The present invention provides improved "serially bonded" magnet structures in which a superconducting coil to coil support structure joint is provided which seeks to minimise stress in the superconducting wire, thereby to maintain wire performance; to minimise peaks of stress and compression at the joint; and to protect the joint from mechanical damage and inclusion of defects which could generate high stress concentrations at the joint.

In order to address these aims, embodiments of the present invention provide placement of additional material at radially inner and/or radially outer surfaces of a joint between coil and spacer. The material is of suitable predetermined modulus and strength.

Embodiments of the present invention provide protection of the joint by placing additional material over the joint. The additional material provides a mechanical barrier to damage and restricts mechanical defects from being created during the creation and lifetime of the joint between coil and support structure.

Embodiments of the invention increase the robustness of the connection during formation of the joint between coil and support structure. The added material provides a more robust joint.

During the manufacturing process, the joint can become damaged or defects may be introduced at the joint. At damage or defect sites, stress concentrations arise and the resultant high stresses could result in failure of the structure or at least microscopic cracks which can initiate quenches when the magnet is in use. Embodiments of the present invention reduce a tendency for formation of defects at the joint and tend to reduce stress in the coil. Such results may be achieved cost effectively when suitable materials are selected.

Figure 3:
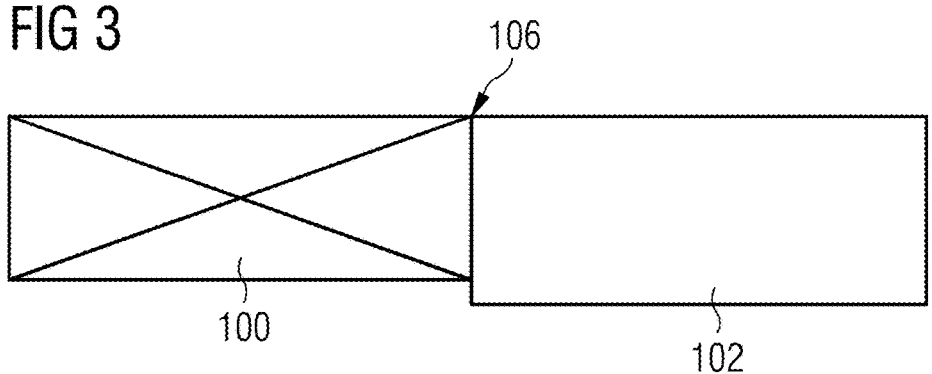
FIGS. 3-6 show partial radial half-cross-sections of a serially bonded coil assembly similar to that shown in FIG. 2, according to the prior art.

FIG. 3 provides a partial cross-sectional view, in the same plane as the view of FIG. 2, of a coil structure 10, comprising a coil 100, a spacer 102 and a joint 106 between coil 100 and spacer 102. The joint may be formed during assembly of the coil spacer by adhesion of a preformed coil 100 and a preformed spacer 102; or wire may be wound to form coil 100 and filler material may be provided to form spacer 102, then the coil and spacer impregnated together in a single impregnation step.

Material boundaries, such as joint 106, are sites for higher stress concentrations due to transitions in material properties: loads applied, change in elastic modulus, change in thermal contraction, change in cross section, etc. The characteristics of joints 106 are the subject of the present invention.

Figure 4:
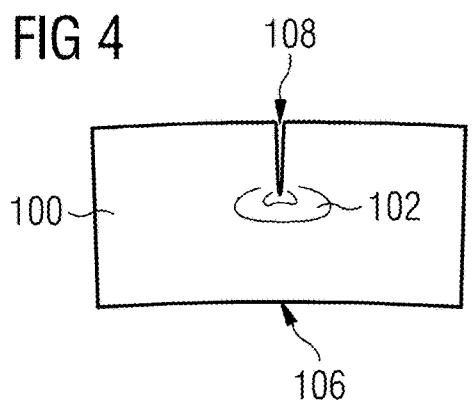

Surface defects in high stress regions are a significant cause of structural failure due to their influence on increasing the stress. FIG. 4 schematically illustrates a surface defect site 108 occurring in a high-stress region at joint 106 between coil 100 and spacer 102. Defect site 108 causes a peak in stress in the adjacent material. This peak stress may degrade the properties of the adjacent material, and may cause propagation of the defect 108.

Figure 5:
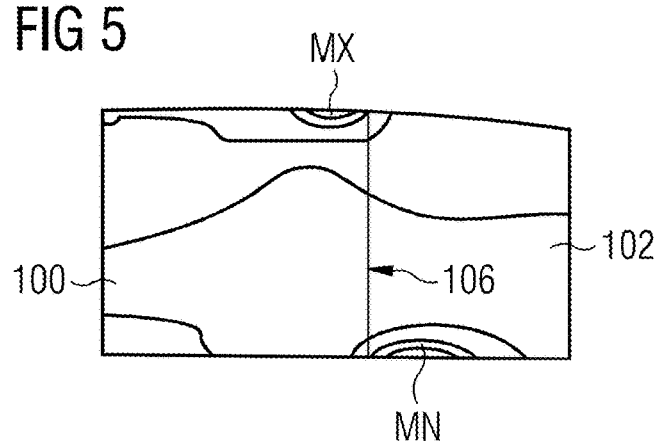

FIG. 5 shows a modeled contour map of stresses within a coil-joint-spacer structure such as illustrated in FIG. 3. A radially-inward deflection is applied to spacer 102, exaggerated for clarity in FIG. 5. A peak stress is shown at MX, with a corresponding peak in compression at MN. Such stresses occur within magnet assembly 10 in use, due to differences in thermal expansion, or hoop stresses in the coil. The differing stresses on radially outer and radially inner surfaces of the magnet assembly 10 may prompt failure of the joint between coil 100 and spacer 102. Any defects near the joint may be enlarged due to the stress concentrations, and the superconducting properties of the coil 100 may be adversely affected by the stress concentration.

Figure 6:
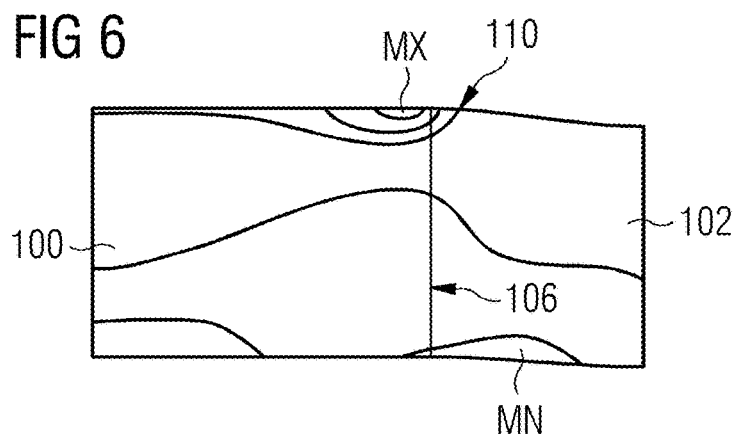

FIG. 6 illustrates a cross-sectional view, corresponding to the view of FIG. 5, of an embodiment of the present invention. As shown, a layer of additional material 110 is positioned on the radially outer surface of the joint 106, overlapping onto both the coil 100 and spacer 102.

As with the illustration of FIG. 5, FIG. 6 shows a radially-inward deflection applied to spacer 102, exaggerated for clarity. The presence of the additional material 110 acts to restrain this deflection, and to reduce the magnitude of the peak stress MX, and peak compression MN. In the illustrated example situation, the material 110 is placed under tension, and acts to restrain relative deflection of the spacer 102 and coil 100.

In other situations, the stresses may be reversed, with the coil 100 tending to shrink with reference to the size of the spacer 102. The peak stress MX will appear at the radially outer surface of the spacer 102 near the joint 106, while the peak compression MN will appear at the radially inner surface of the coil 100 near the joint. Again, the material 110 is placed under tension, and acts to restrain relative deflection of the spacer 102 and coil 100 and to reduce the magnitude of the peak stress MX, and peak compression MN.

Situations may arise in which the coil 100 or the spacer 102 tends to expand with respect to the adjacent component: spacer 102 or coil 100. In such situations, material 110 will be placed under compression. Depending on the material chosen as material 110, it may be less effective in compression. To cater for such situations, certain embodiments of the present invention provide additional material on the radially inner surface of the joint 106, overlapping onto both the coil 100 and spacer 102. The material on the radially inner surface of the joint 106 will be in tension, and will act to restrain any deflection, and to reduce the magnitude of the peak stress, and peak compression in the vicinity of the joint.

In certain embodiments of the present invention, additional material 110 may comprise glass fibre cloth impregnated with epoxy resin. Commonly, superconducting coils 100 comprise turns of superconducting wire impregnated with epoxy resin, and spacers 102 may comprise glass fibre cloth or glass fibre preforms impregnated with epoxy resin. In some embodiments of the invention, additional material 110 may be glass fibre cloth wrapped around the joint between the coil 100 and spacer 102 prior to their impregnation with epoxy resin. A single impregnation step may then be performed to impregnate coil 100, spacer 102 and additional material 110 in a monolithic impregnation. Alternatively, in other embodiments of the present invention, the coil 100 and spacer 102 may be impregnated in a single step to form a monolithic impregnation of both coil and spacer, while the additional material 110 may be added later, for example as a wet-wound strip of epoxy-impregnated glass fibre cloth. In yet other embodiments, the coil 100 may be impregnated separately from the spacer 102, and the coil 100 and spacer 102 may be bonded together in a bonding step, which may be part of the step of forming the spacer by impregnation. The additional material 110 may be wet-wound over the join, or may be wound as a dry strip of glass fibre cloth over the join before impregnation of the spacer 102.

Additional material 110 may alternatively be formed as separate hoops, for example of epoxy resin-impregnated glass fibre cloth which are then placed over the joint 106 and then bonded to the coil 100 and spacer 102 in a bonding step, which may involve introduction of epoxy resin into a gap between the hoop and the coil 100 and spacer 102.

More specific example embodiments of the present invention will now be discussed with reference to FIGS. 7-13.

Figure 7:
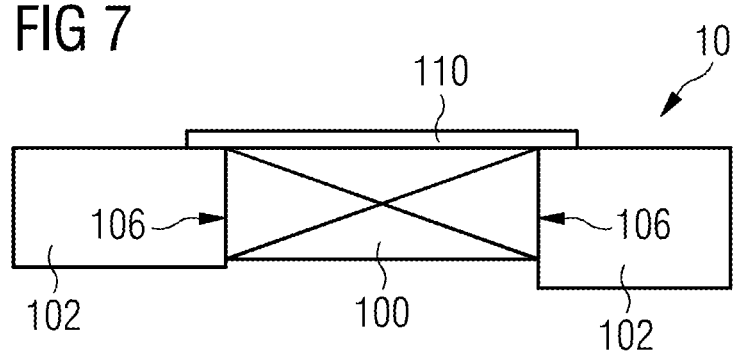
FIGS. 7-13 show partial radial half-cross-sections of a serially bonded coil assembly similar to that shown in FIG. 2, according to embodiments of the present invention.

FIG. 7 shows an example embodiment in which coil 100 is located between spacers 102 and is bonded to the spacers at joints 106. A radially outer layer of additional material 110 is provided, overlaying coil 100, joints 106 and extending onto adjacent regions of spacers 102.

Figure 8:
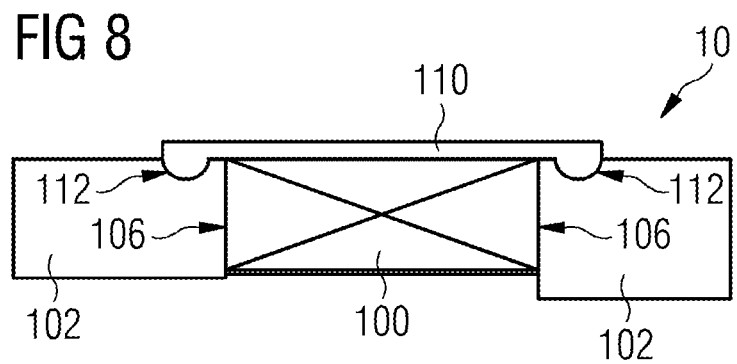

FIG. 8 illustrates an improved embodiment. In this embodiment, spacers 102 are formed with an annular recess 112 on their radially outer surface, in the vicinity of joints 106. Additional material 110 extends into the annular recesses, and provides an improved key and resilience to axially-directed tension in the additional material 110. Such arrangement provides improved resistance to delamination of the additional material 110 from the spacers 102 and coil 100.

Figure 9:
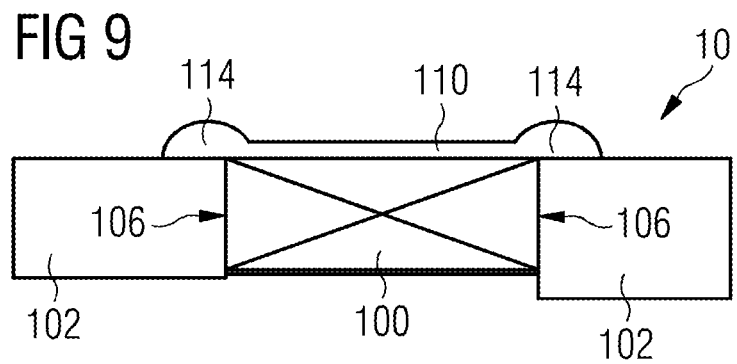

FIG. 9 illustrates a different improved embodiment. In this embodiment, additional material 110 has thickened regions 114 over the radially outer surfaces of joints 106. This arrangement provides improved strength to the joints, due to the increased resistance to deformation at joints 106 caused by the presence of thickened regions 114.

Figure 10:
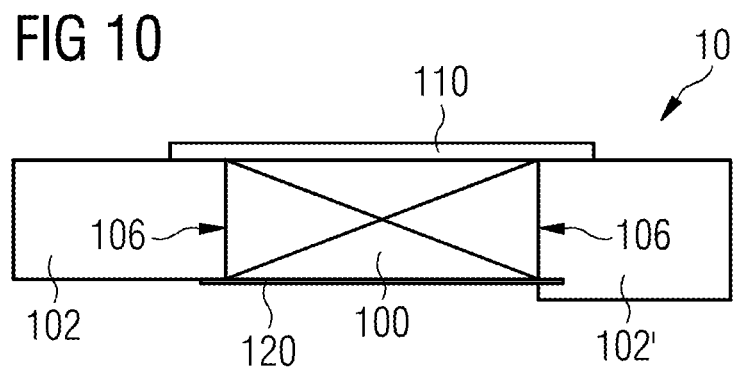

In the embodiment of FIG. 10, one spacer 102 has inner and outer radii identical to inner and outer radii of coil 100. The other spacer 102' has an outer radius identical to the outer radius of coil 100, but a smaller inner radius than the inner radius of coil 100. Layer 110 of additional material covers the radially outer surfaces of joints 106, covers the radially outer surface of coil 100 and extends over adjacent parts of the radially outer surfaces of spacers 102, 102'.

On the radially inner surfaces of the coil 100 and spacer 102, an inner layer 120 of additional material is provided, extending over the radially inner surface of joints 106, the radially inner surface of the coil 100 and extending over an adjacent part of the radially inner surface of spacer 102. Inner layer 120 of additional material extends into a recess formed in spacer 102' at a radial position corresponding to the inner radius of coil 100.

Inner layer 120 of additional material is optional, and may be found advantageous during modeling, depending on the stress state and manufacturing method to be employed.

Figure 11:
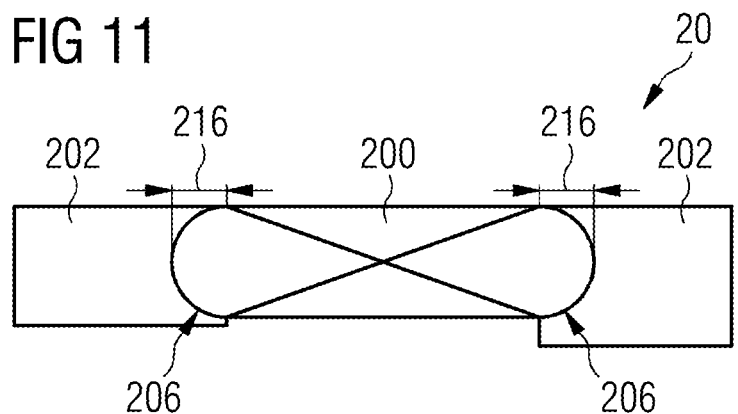

FIG. 11 illustrates a partial radial cross-section of another type of embodiment of the present invention. In this type of embodiment, the coil 200 and spacers 202 are profiled such that the joints 206 between them are not in the form of a simple radial plane. By avoiding a simple, radial planar joint, stresses in the region of the joint causes by differing properties of the coil and the spacer are distributed over a wider volume of the materials of the spacer and the coil, such that the peak values of stress and compression are reduced, and the attendant effects on physical properties of the materials, particularly of coil 200, are reduced. In the illustrated embodiment, coil 200 is formed with an oval profile, and spacers 202 are formed with complementary recesses. Other shapes are of course possible, but seek to distribute the location of joints 106 over an axial extent 216.

Figure 12:
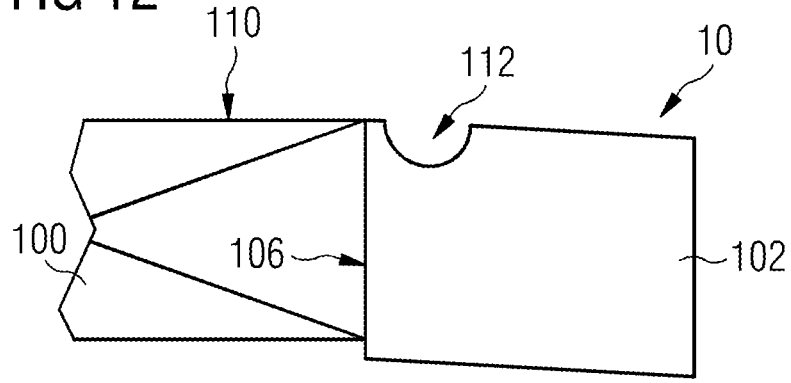
Figure 13:
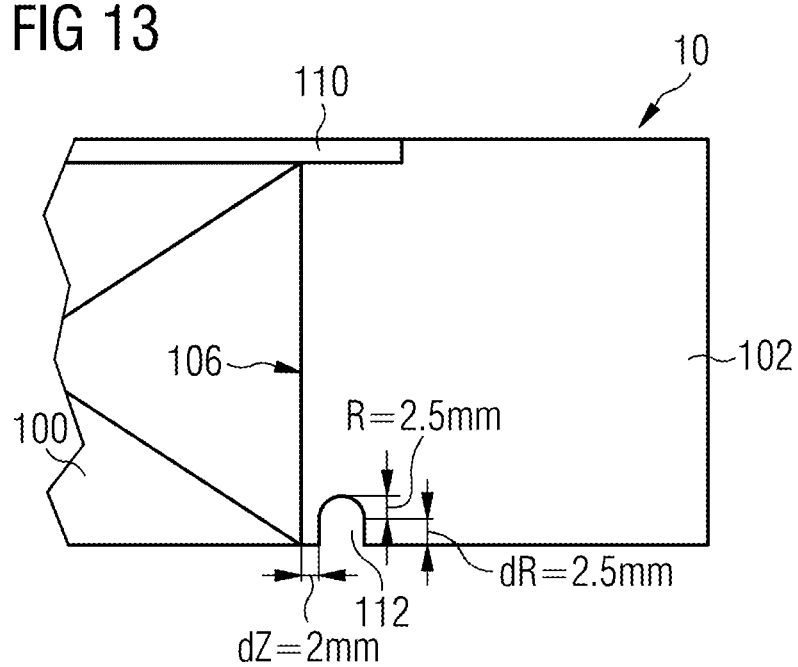

FIG. 12 illustrates a partial radial cross-section of another type of embodiment of the present invention. In this embodiment, spacer 102 is provided with an annular recess 112 around the radially outer circumference of the spacer, in the vicinity of join 106. This recess 112 is similar to recess 112 discussed with reference to FIG. 9. However, in this embodiment, the recess 112 is not filled but rather acts to increase flexibility of the coil assembly by enabling flex within the material of the spacer. FIG. 13 shown an exaggerated deflection of the spacer 102 radially inward, causing a deformation of spacer 102. By allowing, and indeed promoting, flexure within spacer 102, this embodiment reduces peak values of stress and compression in the vicinity of joint 106 and causes the locations of peak values of stress and compression to be located away from the position of joint 106. A layer of additional material 110 may be located over the radially outer surface of the coil, and the adjacent part of spacer 102, covering joint 106, while the recess 112 is positioned further away from the joint. Such provision of a layer of additional material acts similarly to the layer of additional material discussed with reference to FIG. 8, in reducing peak values of stress and compression.

FIG. 13 shows a variant of the embodiment of FIG. 12. In this variant, a layer of additional material 110 is located over the radially outer surface of the coil, and the adjacent part of spacer 102, covering joint 106. Such provision of a layer of additional material acts similarly to the layer of additional material discussed with reference to FIG. 7, in reducing peak values of stress and compression. A recess 112 is positioned on the radially inner surface of the spacer, near joint 106 but displaced away from it by a distance dZ. In the illustrated example, dZ=2 mm, although this value may of course vary in other embodiments. In the illustrated embodiment, recess 112 may have a profile shaped as a rectangle of axial dimension 5 mm, radial dimension 2.5 mm topped by a semicircular region of radius 2.5 mm. This embodiment serves to constrain the radially outer surface of joint 106 by tension in additional material 110, and promote flexure in spacer 102 towards the radially inner surface of the spacer 102 by provision of recess 112. Other locations, shapes and dimensions of recess may of course be provided, and their effect may be determined by a process of digital modeling, as will be familiar to those skilled in the art.

According to the present invention, the locations and magnitude of peaks of stress and compression are adapted by strategic positioning of additional material at joints between coils and spacers in a serially bonded magnet structure. By positioning additional material over the radially outer and/or radially inner extremities of the joints, the peak magnitudes of stresses and compression in the material of the coil structure are reduced, and their location can be shifted away from the joint. Computer modeling may be used to simulate the effect of a particular positioning of additional material. Suitable modeling software will be familiar to those skilled in the art.

The materials covering the joint also serve to protect the join from possible damage during manufacture or assembly of the coil stricture into the cryostat.

The additional material provided in certain embodiments of the present invention may be of resin-impregnated glass fibre cloth. Alternatively, it may be of resin-impregnated carbon fibre cloth, or KEVLAR® cloth. Other possible combinations of material include other resin-impregnated fillers such as cotton fibre, polyester fibre, wood, or indeed any fibrous material compatible with composite production to provide strength and/or crack propagation resistance.

If the additional material that is used is electrically insulating, then it provides a secondary function of providing an electrically insulating barrier to other parts of the superconducting magnet.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A cylindrical superconducting magnet coil structure comprising:
    superconducting coils and spacers bonded together at joints to form a self-supporting structure;
    a radially outer layer of additional material overlaying a joint and extending onto adjacent regions of a spacer and a superconducting coil;
    each coil being joined at respective joints to two respective spacers, each spacer being formed with an annular recess on a radially outer surface, in the vicinity of the respective joint; and
    the additional material extending into the annular recesses, and the additional material comprising a resin impregnated filler material.

2. A cylindrical superconducting magnet coil structure according to claim 1, further comprising additional material overlaying a radially inner surface of the joint, and extending onto adjacent regions of a spacer and a coil.

3. A cylindrical superconducting magnet coil structure according to claim 1, wherein the additional material comprises thickened regions over the radially outer surfaces of joints.

4. A cylindrical superconducting magnet coil structure according to claim 1, wherein:
    a coil is joined at respective joints to two respective spacers, a first spacer having inner and outer radii identical to inner and outer radii of the coil, and a second spacer having an outer radius identical to the outer radius of coil, but a smaller inner radius than the inner radius of coil;
    a radially outer layer of additional material overlays joints, extends over a radially outer surface of the coil and extends onto adjacent regions of first and second spacers; and
    on radially inner surfaces of the coil and first spacer, an inner layer of additional material extends over the radially inner surface of the joints, the radially inner surface of the coil and extending over an adjacent part of the radially inner surface of first spacer, the inner layer of additional material also extending into a recess formed in second spacer at a radial position corresponding to the inner radius of the coil.

5. A cylindrical superconducting magnet coil structure comprising:
    a superconducting coil and a spacer bonded together at joints to form a self-supporting structure;
    the spacer having an annular recess around the radially inner circumference of the spacer, in the vicinity of a joint; and
    a layer of additional material is located over the radially inner surface of the coil, and an adjacent part of the spacer, covering the joint and extending into the annular recess; the additional material comprising a resin impregnated filler material.

* * * * *